United States Patent [19]

Wilson

[11] Patent Number: 4,906,957
[45] Date of Patent: Mar. 6, 1990

[54] ELECTRICAL CIRCUIT INTERCONNECT SYSTEM

[75] Inventor: William J. Wilson, Nashua, N.H.

[73] Assignee: Sanders Associates, Inc., Nashua, N.H.

[21] Appl. No.: 208,424

[22] Filed: Jun. 17, 1988

Related U.S. Application Data

[62] Division of Ser. No. 917,140, Oct. 9, 1986, Pat. No. 4,768,004.

[51] Int. Cl.⁴ .............................................. H01P 1/00
[52] U.S. Cl. ..................................... 333/246; 333/260
[58] Field of Search ................. 333/33, 238, 246, 247, 333/260; 357/84

[56] References Cited

U.S. PATENT DOCUMENTS

| | | | |
|---|---|---|---|
| 2,810,891 | 10/1957 | Engelmann | 333/246 X |
| 2,938,175 | 5/1960 | Sommers et al. | |
| 3,155,881 | 11/1964 | St. Jean | |
| 3,218,584 | 11/1965 | Ayer | |
| 3,792,383 | 2/1974 | Knappenberger | |
| 3,857,115 | 12/1974 | Wisbey | |
| 3,982,271 | 9/1976 | Olivieri et al. | |
| 4,184,133 | 1/1980 | Gehle | 333/246 X |
| 4,262,265 | 4/1981 | Nugren et al. | 333/246 X |
| 4,301,429 | 11/1981 | Goldman et al. | |
| 4,374,368 | 2/1983 | Viola et al. | |
| 4,394,633 | 7/1983 | Klein | 333/246 X |
| 4,424,500 | 1/1984 | Viola et al. | |
| 4,438,436 | 3/1984 | Murphy | 333/238 X |
| 4,575,700 | 3/1986 | Dalman | |
| 4,611,186 | 9/1986 | Ziegner | 333/246 |
| 4,617,586 | 10/1986 | Cuvilliers et al. | |
| 4,633,203 | 12/1986 | Nowak | 333/246 X |
| 4,724,409 | 2/1988 | Lehman | 333/238 X |

OTHER PUBLICATIONS

Coombs, C. F., Jr., ed. *Printed Circuits Handbook* (McGraw-Hill Book Company, New York, San Francisco, 1967), pp. 1-16-1-18.

*Primary Examiner*—Paul Gensler
*Attorney, Agent, or Firm*—Nutter, McClennen & Fish

[57] ABSTRACT

An electrical circuit interconnect system employs an electrically conductive enclosure (57) and cover (64) which completely encompasses, hermetically seals (54) and electrically isolates from the outside environment a component (18) mounted on first surface of an insulating substrate (16) of a microwave circiut (56). A plurality of conductors (12) mounted on the first surface of the insulating substrate (16) electrically connect the component (18) to the outside electrical circuitry by passing under a corresponding plurality of pass-through bores (58) within the base of the enclosure (57). Specifically, within each respective passthrough bore (58), a corresponding glass encased conductor (60 and 62) electrically connects each conductor (12) within the enclosure to a conductor outside of the enclosure (57). A plurality of conductor paths (66) extend through bores in the insulating substrate (16) to electrically connect the enclosure (57) to a circuit ground plane (14) located on a second surface, opposite to the first surface, of the insulating substrate (16).

12 Claims, 5 Drawing Sheets

ELECTRICAL CIRCUIT INTERCONNECT SYSTEM

RELATED APPLICATION

This application is a divisional of Ser. No. 917,140, filed Oct. 9, 1986, now Pat. No. 4,768,004.

FIELD OF THE INVENTION

This invention relates to an assembly for mounting components to an electrical circuit, and in particular it relates to an assembly for connecting components to a microwave circuit formed from microstrip transmission lines.

BACKGROUND OF THE INVENTION

Microstrip transmission lines are frequently used as bases for microwave circuits. These lines comprise one or more flat conductors that are separated from a ground plane by an insulating dielectric or substrate. An important advantage of microstrip transmission lines is their relatively low cost since the circuits can be made by etched circuit techniques. Another important advantage is their structural rigidity, which provides circuit stability in the face of external forces. Furthermore, by varying the lengths, widths, and shapes of the conductors, and by proper positioning of adjacent conductors, discrete components such as capacitors, inductors and couplers can be formed out of microstrip transmission line segments.

Currently, however, there are limitations to the use of microstrip transmission lines. Discrete components, such as diodes, are difficult to shunt to microstrip circuits. It has been necessary to mount the component on a pedestal and place the resulting subassembly in a bored-out section of dielectric in which the ground plane is exposed from above. The subassembly is then secured in the bore so that the diode is in electrical contact with the conductor and the pedestal is in electrical contact with the underlying ground plane.

Furthermore, a sizeable amount of electromagnetic radiation may be propagated or received by a component mounted according to this system. This is significant because inductive coupling between adjacent microwave components, caused by the emission and reception of electromagnetic radiation, may adversely affect the operating characteristics of the individual components. The only way to eliminate the inductive coupling is to electrically isolate the individual components. Often the only way to do this is to distance the components away from each other. This makes it difficult to provide a miniaturized circuit on the microstrip.

Also, it is often desirable to integrate different dielectric materials into a single circuit. For example, with a microstrip circuit having a ceramic dielectric, it may be desirable in short sections of the circuit to take advantage of the different characteristics of material such as fused quartz, plastic, beryllium oxide, or other dielectrics. Previously, it has proved difficult to provide a microwave circuit with more than one type of insulating dielectric. When it has been necessary to provide a circuit with more than one dielectric, a separate circuit would have to be provided for each dielectric.

Furthermore, it is sometimes necessary to provide a microwave circuit with more than one type of transmission line. For example, it may be desirable to provide a circuit composed primarily of microstrip, with short lengths of coaxial line or stripline, which are other forms of microwave transmission lines. Currently, there is no convenient way to provide an integrated circuit having more than one type of transmission line. When it is necessary to use more than one type of transmission line, more than the one circuit must be used.

Also, it is often desirable to connect a microwave circuit to other circuits in order to assemble a complete electronic device. Often these connections are made by way of coaxial cables. It is then necessary to provide coaxial feed-through connectors between the microwave circuits and the cables to which they are connected. Since these feed-throughs are separate components, they have their own inductive coupling characteristics that affect the operation of the circuits. Furthermore, it is costly to electrically connect a feed-through to a circuit, and to mechanically connect it to a circuit's housing.

Additionally, it is sometimes desirable to provide a conventional, non-microwave, circuit, such as one made with a printed wire board, with one or more microwave components. At the present it is difficult to mount such components to such a circuit because the electromagnetic radiation they receive and propagate affects the operation of the entire circuit. As a result it is necessary to mount any microwave components that are part of a conventional circuit to a separate circuit board so they are electrically isolated from the nearby components.

A need therefore exists for a new electrical circuit interconnection system so that components can be readily connected to a microstrip circuit. The system should allow for the components to be readily connected to both the conductor and the ground plane. The interconnection system should also provide a sufficient degree of electrical isolation so the effects of inductive coupling will be minimal. Alternatively, the system should provide total electrical isolation of components so as to eliminate all inductive coupling between adjacent components. This would provide a means for integrally mounting a set of microwave components to a conventional circuit.

Furthermore, the system should allow for sections with different dielectrics, or sections of different types of transmission lines to be connected to the basic stripline microwave circuit. The interconnection system should also make it possible to readily connect a coaxial feed-through connector to a microwave circuit so that it is an integral part of the circuit.

SUMMARY OF THE INVENTION

An electrical circuit interconnect system embodying this invention comprises an electrically conductive enclosure and cover which completely encapsulates and hermetically seals a component mounted on a top surface of an insulation substrate of a microwave circuit. A plurality of conductors also mounted on the top surface of the insulating substrate electrically connects the component to the outside electrical circuitry by passing under a corresponding plurality of passthrough bores within the base of the enclosure. Specifically, within each respective bore, a corresponding glass-encased conductor electrically connects the enclosed conductor with an external conductor. A plurality of conductor paths bored through the insulating substrate electrically connect the enclosure to a circuit ground plane located on the bottom surface of the insulating substrate.

By physically moving the above apparatus to the edge of the substrate and then slightly modifying this apparatus, an electrical isolation system embodying this invention can be made which provides a simple attachment for a coaxial cable connector. For this, the electrical isolation system mentioned above remains virtually the same except that the circuit ground plane extends around and over the edge of the insulating substrate and onto the top surface of the insulating substrate. Further, a semi-circular cut is formed within the ground plane edge and this coupled with the moving of the electrical isolation system to the cut edge allows for direct electrical connection between the electrically isolated component and the coaxial cable through the glass-encased conductor.

DETAILED DESCRIPTION OF THE DRAWINGS

DETAILED DESCRIPTION OF THE PREFERRED EMBODIMENT

Figure 1:
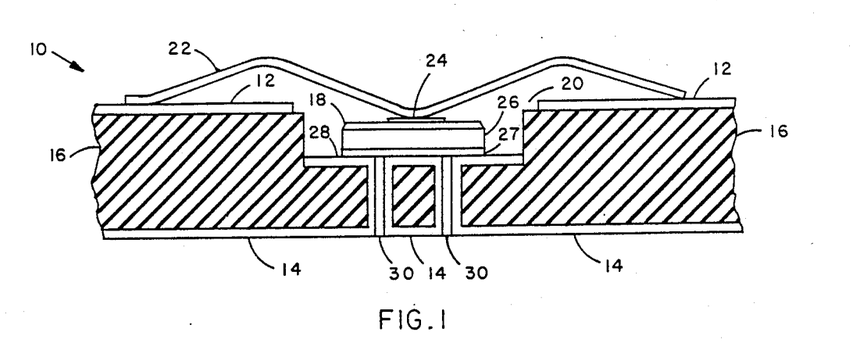
FIG. 1 is a cross-sectional view of a microstrip circuit containing an electrical component connected according to this invention.

FIG. 1 illustrates a basic microstrip transmission line 10 comprising conductors 12 separated from a ground plane 14 by an insulating substrate, or dielectric, 16. The conductors and ground plane are formed of a metal, typically copper, and the insulating dielectric is composed of a ceramic or other suitable material. According to the interconnect system of this invention, an electrical component, here a diode 18, is mounted within a recess 20 formed in the dielectric 16. The recess 20 has a depth such that the top of the diode 18 is substantially coplanar with the top surface of the transmission line 10. The diode is connected to the conductors 12 by a conductive ribbon 22 that extends between a bonding point 24 on the diode and adjacent points on the conductors 12. The diode 18 is provided with a planar ground conductor 26 that is connected to the circuit ground plane 14 through a conductive disc 27 at the base of the recess.

More specifically, the base of the recess 20 is provided with a conductive plating 28. The disc 27 is attached to the conductive plating. Plated holes 30, that extend through the dielectric 16, provide a lowimpedance path between the plating 28 and the circuit ground plane 14. The plating 28 is preferably formed by plating at the same time that the holes 30 are plated. The plating 28 is in effect an offset portion of the ground plane 14 and by contacting the plating 28, the diode ground conductor 26 is thus connected to the ground plane.

There are a number of advantages to the interconnect system of this invention. It eliminates the need to provide a pedestal when mounting a component in a microstrip circuit. Also, the component is housed inside a cavity that is shallow by comparison with the standard bore that components are currently housed in. This reduces the difficulty of connecting the component to ground plane.

Furthermore, the recess plating 28 and plated holes 30 provide a low-impedance path between the component ground plane 26 and the circuit ground plane 14. In effect, therefore, the component 18 has a common ground with the rest of the circuit. The disc 27 prevents any moisture from seeping into the component. If the plated holes are spaced less than one-half a wave length apart of the circuit's highest operating frequency there is only a minimal possibility of the ground plane developing a current that could affect the operation of the circuit. Therefore, the propagation and reception of stray electromagnetic radiation by the component is significantly reduced. Also due to the hole side wall plating components can be spaced together more closely than was previously possible.

Figure 2:
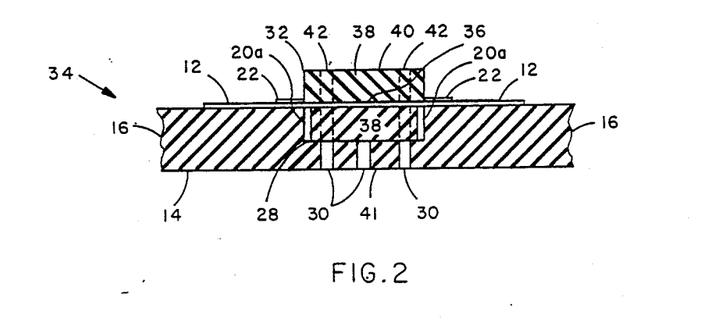
FIG. 2 is a cross-sectional view of a microstrip circuit containing a stripline transmission line mounted according to this invention.

As illustrated by FIG. 2, a section of stripline 32 may be mounted on a microstrip circuit 34 in accordance with this invention. The stripline section 32 consists of a center conductor 36 embedded between two layers of dielectric 38, with ground planes 40 and 41 on the exposed sides of the dielectrics. The top ground plane 40 is connected to the bottom ground plane 41 by conductive pins 42 that extend through the dielectrics and are spaced away from the conductor 36. The stripline section is mounted in a recess 20a formed by the circuit dielectric 16 so that one dielectric layer 38 and the bottom ground plane 41 are within the recess. The stripline conductor 36 is connected to the adjacent microstrip circuit conductors 12 by the ribbons 22. The bottom ground plane 41 is in contact with the recess plating 28 that is connected to the circuit ground plane 14 through the plated holes 30.

Figure 8:
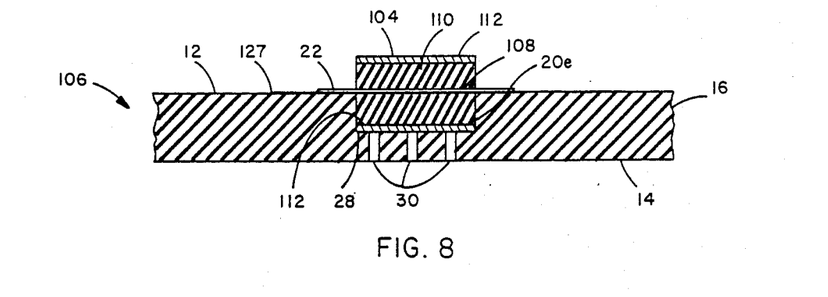
FIG. 8 is a cross-sectional view of a microstrip circuit containing a coaxial transmission line mounted according to this invention.

As is illustrated in FIG. 8, it is similarly possible to mount a section 104 of coaxial line on a microstrip circuit 106 in accordance with this invention. The coaxial line section comprises a center conductor 108 coaxial an outer ground conductor or shield 112. A cylindrical dielectric 110 is disposed with the space between the conductors 108 and 112. The coaxial section 104 is mounted in a recess 20e in the circuit dielectric 16. The conductive ribbons 22 are used to connect the terminal ends of the coaxial center conductor 108 to the adjacent circuit conductors 12. The coaxial shield 112 contacts the recess plating 28 that is connected to the circuit ground plane 14 through the plated holes 30. It may be desirable to provide an insulated covering (not illustrated) around the portion of the coaxial shield 112 that projects above the surface of the dielectric 16.

Figure 3:
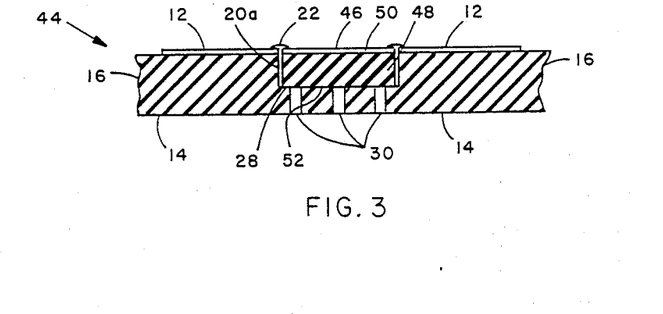
FIG. 3 is a cross-sectional view of a microstrip circuit containing a length of microstrip having a dielectric different than that of base circuit mounted according to this invention.

As shown in FIG. 3, a microstrip circuit 44 may have a section 46 with a dielectric formed of different material than that used in the base microstrip. For example, the base microstrip 44 may have a dielectric 16 formed from ceramic or plastic, and the section 46 have either a fused quartz or beryllium oxide dielectric 48. The section 46 is housed inside the recess 20b in the circuit dielectric 12 and it has a conductor 50 connected to the adjacent circuit conductors 12 by the ribbons 22. The section 46 has a ground plane 52 that contacts the plating 28 at the base of the recess 20b. Again, the plated holes 30 provide a low-impedance path from the section ground plane 52 and recess plating 28 to the circuit ground plane 14.

Figure 9:
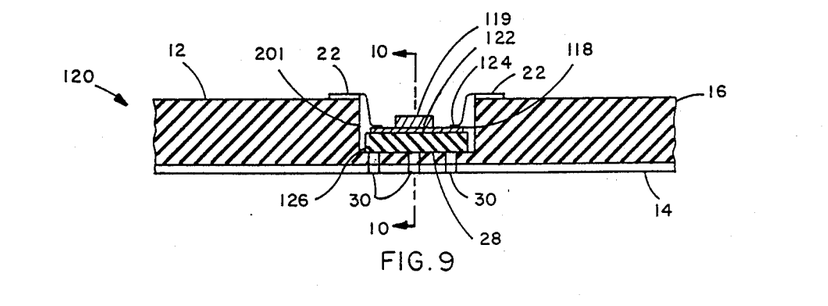
FIG. 9 is a longitudinally extending cross-sectional view of a microstrip circuit containing a shielded section of microstrip mounted within the circuit according to this invention.
Figure 10:
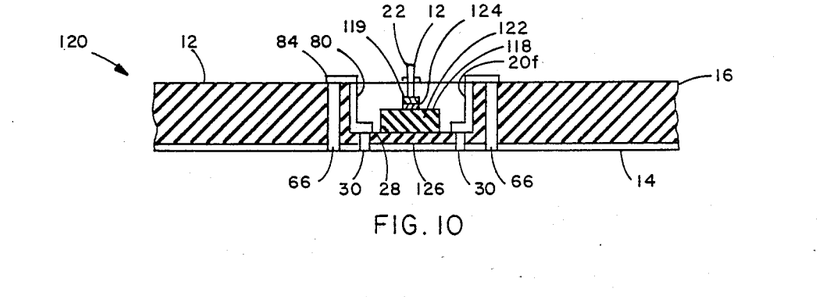
FIG. 10 is a laterally extending cross-sectional view of the microstrip circuit of FIG. 9 taken along line 10—10.
Figure 11:
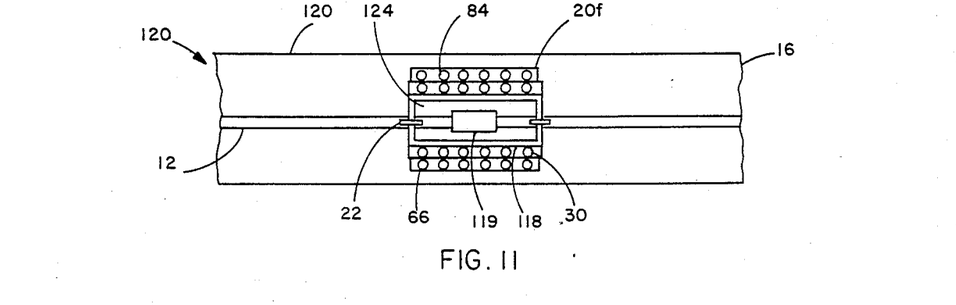
FIG. 11 is a top view of the microstrip circuit of FIGS. 9 and 10.

As illustrated in FIGS. 9, 10 and 11, it is also possible to mount a microstrip section 118 with a component 119 wholly within a recess 20f of a microstrip circuit 120. The microstrip section 118 has a dielectric 122 that has a vertical profile substantially less than that of a recess 20f. The dielectric may also have a width less than that of the recess 20f. The microstrip section 118 also has a conductor 124 on the top first surface of the dielectric 122 and a ground plane 126 that subtends the base of the dielectric 122. The component 119 may be mounted to the microstrip section 118 in any manner convenient to the circuit design. The section conductor 124 is connected to the circuit conductor 12 by the ribbons 22. The section ground plane 126 contacts the recess plating 28.

The recess 20f is provided with side wall plating 80, integral with the base plating 28. The side wall plating 80 is disposed around most of the vertical side walls of the recess 20f. Additional shielding is provided by surface plating 84 on the dielectric 16 adjacent the recess 20f that is an extension of the side wall plating 80. Plated holes 66, that extend completely through the circuit dielectric 16, provide a low-impedance path between the surface shielding 84 and the ground plane 14. A transmission line section mounted according to this embodiment of this interconnect system is thus electrically isolated from spurious electromagnetic radiation on three sides.

Thus, this interconnect system also makes it possible to mix transmission lines on a base microstrip circuit, or provide sections with a different dielectric than the base circuit. The transmission line section 32, 46, 104, or 118 is mounted within the appropriate recess 20 as if it was a component. The recess plating 28 and the plated holes 30 provide a low-impedance path from the section ground plane or shielding 41, 52, 112 or 126 to the circuit ground plane 14 so that the section of transmission line mounted to the circuit has a ground plane that is integral with the circuit ground plane.

Figure 4:
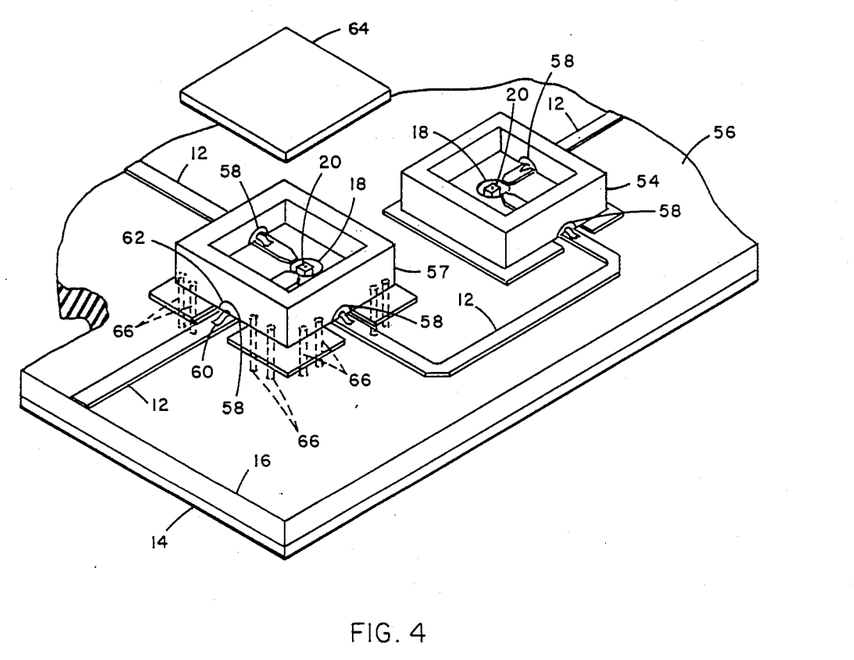
FIG. 4 is an exploded top isometric view of a microstrip circuit containing a hermetically shielded component mounted according to this invention.

As is illustrated in FIG. 4, it is also possible to electrically isolate a component with a hermetic seal. Here, an individual component, such as the diode 18 is housed inside the recess 20 of a microstrip circuit 56 as previously described. A hermetic seal 54 includes a side wall enclosure 57 formed of an electrically conductive material, such as aluminum, that is suitably sealed to the dielectric 16 around the component 18. Feed-throughs 58 are provided at the base of the enclosure 57 so the component 18 can be connected to the external circuit conductors 12. Specifically, a conductive ribbon 60, encased within an insulating glass bead 62 within each feed-through 58 provides a conductive path interconnecting the conductors 12 internal to and external to the enclosure 57. A cover 64, also of electrically conducting material, is sealed over the top of the enclosure 57. Plated holes 66, that extend between the surface of the circuit dielectric 16 underneath the enclosure 57 and the circuit ground plane 4, provide a low-impedance path between the seal 54 and the circuit ground plane.

Figure 5:
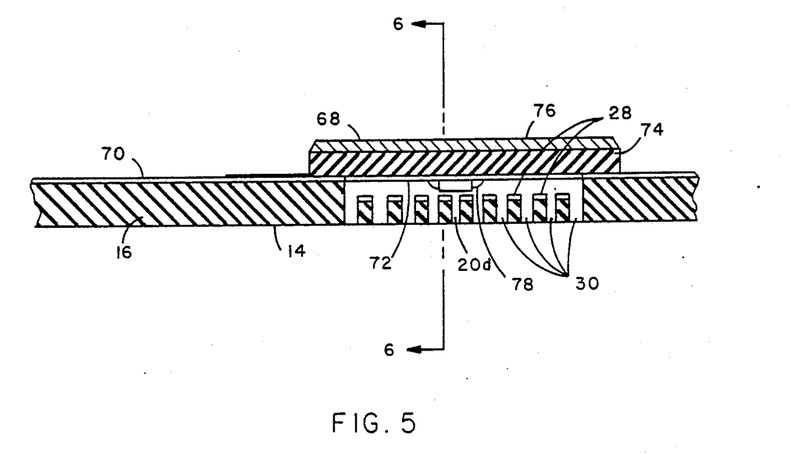
FIG. 5 is a longitudinally extending cross-sectional view of a microstrip circuit containing an inverted microstrip mounted according to this invention.
Figure 6:
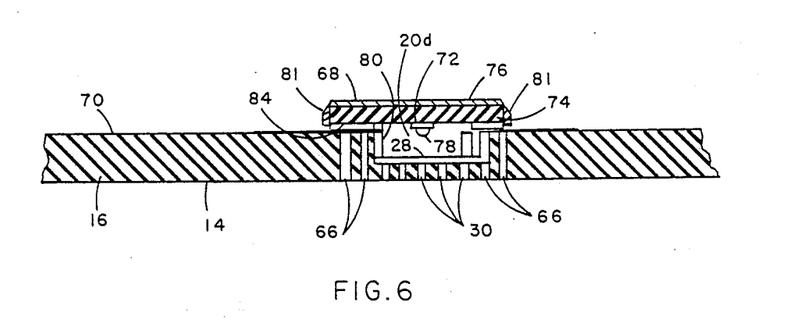
FIG. 6 is a laterally extending cross-sectional circuit with a view of a microstrip circuit with a section of inverted microstrip mounted to it taken along line 6—6 of FIG. 5.

As is illustrated in FIGS. 5 and 6, a component may also be electrically isolated by mounting it on a section of inverted microstrip and mounting the inverted microstrip to a base circuit. An inverted microstrip 68 comprises a conductor 72 fastened to the bottom of an insulating dielectric 74, with a ground plane 76 on top of the insulating substrate. The ground plane 76 is part of a ground plating 81 that extends around the edges of the dielectric 74 and on to the perimeter of the substrate surface on which the conductor 72 is mounted. A component 78 may be mounted to the inverted microstrip in any manner convenient to the circuit design. A recess 20d accommodating the component is provided with the recess plating 28 and with side wall plating 80, integral with the base plating, that extends at least partially around the walls of the recess. Surface plating 84 is provided on the dielectric adjacent the recess 20d.

The inverted microstrip 68 is mounted on the base circuit 70 so that the component 78 is within the recess 20d, the inverted microstrip conductor 72 overlaps adjacent circuit conductors, and the inverted microstrip plating 81 overlaps the adjacent circuit surface plating 84. Plated holes 30 between the recess plating 28 the circuit ground plane 14 and plated holes 66 between the surface plating 84 and the ground plane provide a low-impedance path between the platings 28, 80, 81 around the component and the ground plane 14.

An advantage of the aforesaid embodiments of this invention is that a component is mounted to the circuit within an electrically grounded cavity. Thus, the component will not be affected by the reception or propagation of electromagnetic radiation to or from nearby components.

Figure 7:
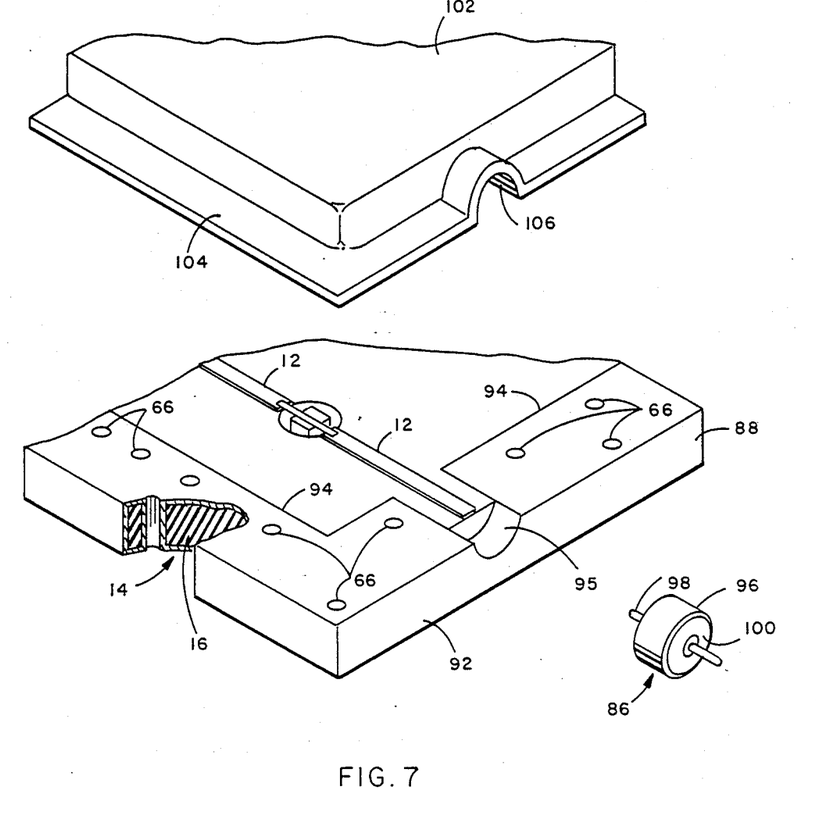
FIG. 7 is an exploded top isometric view of microstrip circuit with a coaxial feed-through connector and a cover mounted according to this invention.

As is illustrated in FIG. 7, a coaxial feed-through connector 86 may be made an integral part of a microstrip circuit 88. The circuit ground plane 14 is part of a ground plating 92 that extends around the edges of the dielectric 16 and over the outer perimeter of the dielectric surface carrying the conductors 12, so as to form a lip 94 at least partially around the dielectric. A semi-circular cut 95 is formed in the lip adjacent the conductors to be connected to a coaxial line. The feed-through 86 comprises a conductive cylinder 96 for connection to the coax shielding and a pin 98 extending axially through the cylinder for connection to the coax conductor. A glass spacer 100 may be disposed around the pin 98 to secure it in, and insulate it from, the cylinder 96.

The feed-through 86 is attached to the circuit with the cylinder 96 secured to the frame within the cut 95 and the transmission pin 98 is in contact with the terminal end of the circuit conductor 12. Plated holes 66 adjacent the cut 95 extend between the lip 94 and the circuit ground plane 14 to provide a short, low-impedance path between the feed-through 86 and the ground plane.

A cover 102, of electrically conductive material may be provided over the top of the circuit 88 to provide mechanical protection and electrical isolation. The cover includes a lip 104 that extends around the outer perimeter of the cover and is sealed to the circuit lip 94. A semi-circular indenture 106 in the lip is adjacent the circuit ground plane cut 95 so the feed-through 86 may be accommodated. A number of plated holes 66, extending from the circuit lip 94 and the circuit ground plane 14 around the dielectric 16 provide a low-impedance path between the cover 102 and the ground plane.

The plated holes 66 provide a low-impedance conductive path from the feed-through 86 and the cover 102 to the ground plane so they are electrically integral with it. The circuit ground plane lip 94 and the cover lip 104 can be extended over the surface of the dielectric a sufficient distance to eliminate any propagation or reception of stray electromagnetic radiation by the enclosed circuit. In such instances the plated holes 66 provide a low-impedance path between the inner edges of the circuit lip 94 of the ground plating 92 and the ground plane 14.

This system prevents the lip 94 and the region beneath it from electrically affecting the operation of the circuit through the generation of unwanted electromagnetic waves. Thus a complete, protected microstrip circuit with external connectors can be isolated electrically, thereby avoiding unwanted reception or propagation of spurious electromagnetic radiation. This makes it possible to conveniently and economically connect microstrip circuits to other circuits in order to assemble an electronic device. Furthermore, the housing and feed-through connector assembly of this invention can be sufficiently miniaturized so an electronically isolated microwave sub-circuit can be directly connected to a conventional, non-microwave circuit assembly.

Alternative embodiments of this invention can be provided without departing from the scope of the claimed invention. For example, the plated through bore holes can be replaced with solid conductors having a star-shaped cross section or any other conductor that can provide a low-impedance path to the ground plane. In some situations it may not be necessary to provide the disc 27 at the base of the recess. Also, the recess side wall plating 80, surface plating 84 and plated holes 66 may be provided in instances where it is desirable to further shield a component housed in the recess 20. Furthermore, other types of components and transmission lines may be connected to a microstrip circuit according to the interconnect system of this invention than those described.

Also, the interconnect system of this invention is not limited to solely microstrip or even microwave circuits. This system may be used with any circuit where two or more conductors are spaced apart from each other by dielectric layers. For instance, in a stripline circuit a plated hollow may be formed around a center conductor and a component may be mounted within the hollow. A set of low-impedance paths leading from the hollow to the circuit ground planes would turn the hollow into an electrical cavity isolated from external electromagnetic radiation.

Alternatively, a conventional printed wire board circuit may have a signal conductor and a ground conductor located on the opposite sides of a substrate board. A recess may be formed in the surface of the substrate carrying the signal conductor. The recess would be plated and the plating connected to the ground conductor by one or more low-impedance paths that extend through the substrate. Thus an isolation cavity would be formed on the surface of the substrate carrying the signal conductor. A component mounted in the recess would thus be isolated from the propagation or reception of spurious electromagnetic radiation. Therefore, it is intended that all matter contained in the above description or shown in the accompanying drawings be interpreted as illustrative and not in a limited sense.

What is claimed as new and desired to be secured by Letters Patent of the United States is:

1. An assembly for electrically isolating at least one component mounted on an electrical circuit, said circuit comprising at least one conductor on a first surface of an insulating substrate and a ground plane over a second surface of said surface opposite said first surface, the assembly comprising:
   a. an enclosure composed of conductive material mounted on said first substrate of said insulating substrate so as to enclose the component to be isolated, said enclosure forming at least one pass-through bore adjacent to said insulating substrate, said conductor electrically connected to said component through said pass-through bore;
   b. a cover composed of conductive material secured over said enclosure; and
   c. at least one conductive path from said enclosure extending to said ground plane through said insulating substrate.

2. The assembly of claim 1 wherein said conductor is in electrical communication with said component through a glass-encased conductor in said passthrough bore.

3. An interconnection assembly for providing a connection between a microstrip circuit and a coaxial cable, the microstrip circuit comprising at least one conductor on a first surface of an insulating substrate and a ground plane located on a second surface of said insulating substrate, opposite said first surface, said conductor terminating adjacent on outer edge of said substrate, the assembly comprising:
   a. a conductive lip located around at least a portion of the outer edge of said insulating substrate, said conductive lip extending from said ground plane and having a cut adjacent to the first surface of said substrate where said conductor terminates, said substrate having a groove aligned with said cut; and
   b. a coaxial feed through connector comprising a cylindrical section and a transmission pin extending axially through the cylindrical section, said cylindrical section being mounted in said groove, said transmission pin being electrically secured to said adjacent conductor.

4. The assembly of claim 3 wherein said assembly further comprises said conductive lip extending around at least a portion of the outer perimeter of the surface of the insulating substrate containing said conductor, said conductive plating spaced away from said conductor.

5. The assembly of claim 3 wherein at least one low-impedance conductive path is provided through the insulating substrate between said conductive lip on said first substrate surface and said ground plane.

6. The assembly of claim 5 wherein said conductive path is a plated hole that extends through said substrate between said conductive plating and said ground plane.

7. The assembly of claim 3 further including a cover formed of electrically conductive material over said first substrate surface, said cover including a lip in contact with said circuit lip.

8. An interconnection assembly for providing a cover for a microstrip circuit said microstrip circuit comprising at least one conductor on a first surface of an insulating substrate and a ground plane located on a second surface of said insulating substrate opposite said first surface, the assembly comprising:
  a. a conductive frame located around at least a portion of the outer perimeter of said substrate surface supporting said conductor, said conductive frame comprising plating integral with said ground plane; and
  b. a cover formed of electrically conductive material over said substrate surface, said substrate surface supporting said cover, said cover including a lip extending around the outer perimeter of said cover, said lip being in contact with said conductive frame.

9. The assembly of claim 8 further providing a low-impedance conductive path between said conductive frame and said ground plane, said conductive path extending through said insulating substrate.

10. The assembly of claim 9 wherein said low-impedance conductive path is a plated hole that extends through said substrate between said conductive frame and said microstrip ground plane.

11. An assembly for electrically isolating at least one component mounted on an electrical circuit, said circuit comprising at least one conductor on a first surface of an insulating substrate and a ground plane over a second surface of said substrate opposite said first surface, the assembly comprising:
  a. an enclosure composed of conductive material mounted on said first surface of said insulating substrate so as to house and electrically isolate the component, said enclosure forming at least one pass-through bore adjacent to said insulating substrate, said conductor electrically connected to said component through said pass-through bore; and
  b. at least one conductive path from said enclosure extending to said ground plane through said insulating substrate.

12. The assembly of claim 11 wherein said conductor is in electrical communication with said component through a glass encased conductor located in said pass-through bore.

* * * * *